United States Patent
Tanaka et al.

(10) Patent No.: US 9,006,748 B2
(45) Date of Patent: Apr. 14, 2015

(54) SEMICONDUCTOR DEVICE AND METHOD FOR MANUFACTURING SAME

(71) Applicant: Panasonic Corporation, Osaka (JP)

(72) Inventors: Koutarou Tanaka, Osaka (JP); Masao Uchida, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/375,596

(22) PCT Filed: Nov. 26, 2013

(86) PCT No.: PCT/JP2013/006927
§ 371 (c)(1),
(2) Date: Jul. 30, 2014

(87) PCT Pub. No.: WO2014/087601
PCT Pub. Date: Jun. 12, 2014

(65) Prior Publication Data
US 2014/0374774 A1 Dec. 25, 2014

(30) Foreign Application Priority Data

Dec. 3, 2012 (JP) .................................. 2012-264122

(51) Int. Cl.
*H01L 29/15* (2006.01)
*H01L 31/0312* (2006.01)
(Continued)

(52) U.S. Cl.
CPC ........ *H01L 29/0619* (2013.01); *H01L 29/1608* (2013.01); *H01L 21/02529* (2013.01); *H01L 21/765* (2013.01); *Y10S 438/931* (2013.01)

(58) Field of Classification Search
USPC .................... 257/77, 200, E21.603, E21.605, 257/E29.104, E29.297, E29.298; 438/931
See application file for complete search history.

(56) References Cited

U.S. PATENT DOCUMENTS 5,976,936 A 11/1999 Miyajima et al.
6,054,752 A 4/2000 Hara et al.
(Continued)

FOREIGN PATENT DOCUMENTS

JP 10-270370 A 10/1998
JP 11-266014 A 9/1999
(Continued)

OTHER PUBLICATIONS

International Search report for corresponding International Application No. PCT/JP2013/006927 mailed Jan. 14, 2014.
(Continued)

*Primary Examiner* — Ida M Soward
(74) *Attorney, Agent, or Firm* — Renner, Otto, Boisselle & Sklar, LLP

(57) ABSTRACT

This semiconductor device includes a silicon carbide layer of a first conductivity type having first and second principal surfaces and including an element region and a terminal region surrounding the element region on the first principal surface. The silicon carbide layer includes a first dopant layer of the first conductivity type contacting with the first principal surface and a second dopant layer of the first conductivity type located closer to the second principal surface than the first dopant layer is. The terminal region has, in its surface portion with a predetermined depth under the first principal surface, a terminal structure including respective portions of the first and second dopant layers and a ring region of a second conductivity type running through the first dopant layer to reach the second dopant layer. The dopant concentration of the first dopant layer is twice to five times as high as that of the second dopant layer 22. When viewed along a normal to the first principal surface, the first dopant layer is arranged to contact with the ring region both inside and outside of the region.

12 Claims, 8 Drawing Sheets

(51) Int. Cl.
*H01L 29/739* (2006.01)
*H01L 31/0328* (2006.01)
*H01L 31/0336* (2006.01)
*H01L 31/072* (2012.01)
*H01L 31/109* (2006.01)
*H01L 29/06* (2006.01)
*H01L 29/16* (2006.01)
*H01L 21/02* (2006.01)
*H01L 21/765* (2006.01)

(56) References Cited

U.S. PATENT DOCUMENTS

| | | | | |
|---|---|---|---|---|
| 7,816,733 | B2* | 10/2010 | Okuno et al. | 257/339 |
| 8,169,022 | B2* | 5/2012 | Cheng et al. | 257/335 |
| 8,324,704 | B2* | 12/2012 | Yamamoto et al. | 257/473 |
| 8,395,163 | B2* | 3/2013 | Tamaso | 257/77 |
| 8,519,452 | B2* | 8/2013 | Malhan | 257/280 |
| 8,803,277 | B2* | 8/2014 | Henning et al. | 257/496 |
| 8,901,639 | B2* | 12/2014 | Ryu | 257/328 |
| 2004/0135153 | A1 | 7/2004 | Ryu et al. | |
| 2005/0258454 | A1 | 11/2005 | Kumar et al. | |
| 2008/0153216 | A1* | 6/2008 | Kumar et al. | 438/173 |
| 2012/0286290 | A1 | 11/2012 | Uchida | |
| 2013/0214291 | A1 | 8/2013 | Uchida et al. | |
| 2014/0138705 | A1* | 5/2014 | Zhang et al. | 257/77 |
| 2014/0291691 | A1* | 10/2014 | Disney et al. | 257/76 |
| 2014/0319646 | A1* | 10/2014 | Henning et al. | 257/496 |
| 2014/0327019 | A1* | 11/2014 | Kinoshita et al. | 257/77 |
| 2014/0353678 | A1* | 12/2014 | Kawakami et al. | 257/76 |

FOREIGN PATENT DOCUMENTS

| | | |
|---|---|---|
| JP | 2002-033479 A | 1/2002 |
| JP | 3385938 B | 1/2003 |
| JP | 2005-327870 A | 11/2005 |
| JP | 2005-340250 A | 12/2005 |
| JP | 2008-227236 A | 9/2008 |
| JP | 2011-243999 A | 12/2011 |
| JP | 5015361 B | 6/2012 |
| WO | WO 2011/141981 A1 | 11/2011 |
| WO | WO 2012/157679 A1 | 11/2012 |

OTHER PUBLICATIONS

Form PCT/ISA/237 for corresponding International Application No. PCT/JP2013/006927 dated Jan. 14, 2014 and partial English translation.

Uchida et al., "Novel SiC Power MOSFET with Integrated Unipolar Internal Inverse MOS-Channel Diode", 2011 IEEE International Electron Devices Meeting (IEDM 2011) 26.6.1-4, IEDM11-602-605.

Uchida et al., "Sic Power MOSFET with Integrated Unipolar MOS-Channel Diode (DioMOS)", Proceedings of 21st Meeting on SiC and Related Wide Bandgap Semiconductors (held on Nov. 19 and 20, 2012 at Osaka), p. 160 and concise explanation.

* cited by examiner (a)

(b)

SEMICONDUCTOR DEVICE AND METHOD FOR MANUFACTURING SAME

TECHNICAL FIELD

The present application relates to a semiconductor device and more particularly relates to a vertical semiconductor element which uses silicon carbide.

BACKGROUND ART

Silicon carbide (SiC) is a high-hardness semiconductor material with a greater bandgap than silicon (Si), and is expected to be used extensively in various types of semiconductor devices including power elements, hostile-environment elements, high temperature operating elements, and radio frequency elements. Among other things, the application of SiC to power elements such as switching elements and rectifiers has attracted a lot of attention. This is because a power element that uses SiC can significantly reduce the power loss compared to a Si power element. In addition, by utilizing such properties, SiC power elements can form a semiconductor device that has an even higher breakdown voltage, would involve smaller loss, and has a smaller size than Si power elements (see Patent Document No. 1, for example).

It is important for a semiconductor device that uses silicon carbide to determine what terminal structure is used to ensure a breakdown voltage in OFF state. In general, a terminal structure is arranged on the outer periphery of a chip on which a semiconductor element is provided. As the terminal structure, a field limited ring (which will be referred to herein as "FLR") structure, a junction termination extension (which will be referred to herein as "JTE") structure, a mesa structure or any other suitable structure is used extensively. The FLR and JTE structures have a dopant ion implanted region on the outer peripheral area of the chip. On the other hand, the mesa structure is formed by a level difference which has been created on the outer peripheral area of the chip. In the mesa structure, a dopant ion implanted region is sometimes provided in the vicinity of the level difference, too.

CITATION LIST

Patent Literature

Patent Document No. 1: Japanese Patent Publication No. 3385938

SUMMARY OF INVENTION

Technical Problem

To make full use of those features of a semiconductor device that uses SiC, its breakdown voltage in OFF state should be further increased compared to a conventional semiconductor device.

A non-limiting exemplary embodiment of the present application provides an SiC semiconductor device with a sufficiently high breakdown voltage and a method for fabricating such a semiconductor device.

Solution to Problem

A semiconductor device according to an aspect of the present invention includes a silicon carbide layer of a first conductivity type which has a first principal surface and a second principal surface and which includes an element region and a terminal region that surrounds the element region on the first principal surface. The silicon carbide layer includes a first dopant layer of the first conductivity type which contacts with the first principal surface and a second dopant layer of the first conductivity type which is located closer to the second principal surface than the first dopant layer is. The terminal region has, in its surface portion with a predetermined depth as measured from the first principal surface, a terminal structure which includes a portion of the first dopant layer, a portion of the second dopant layer, and a ring region of a second conductivity type that runs through the first dopant layer to reach the second dopant layer. The dopant concentration of the first dopant layer is twice to five times as high as the dopant concentration of the second dopant layer. And when viewed along a normal to the first principal surface, the first dopant layer is arranged to contact with the ring region both inside and outside of the region.

Advantageous Effects of Invention

According to a semiconductor device and method for fabricating the device as disclosed in the present application, even if a portion of the surface region of a silicon carbide layer has been lost during the manufacturing process of a semiconductor device, influence on a decrease in breakdown voltage can be reduced, and an SiC semiconductor device with a sufficiently high breakdown voltage can be provided by minimizing a dispersion in breakdown voltage between semiconductor devices being fabricated.

DESCRIPTION OF EMBODIMENTS

The present inventors carried out researches to provide an improved terminal structure that would increase the breakdown voltage of a conventional SiC semiconductor device. Hereinafter, a terminal structure which was inspected by the present inventors will be described with reference to the accompanying drawings.

Figure 1A:
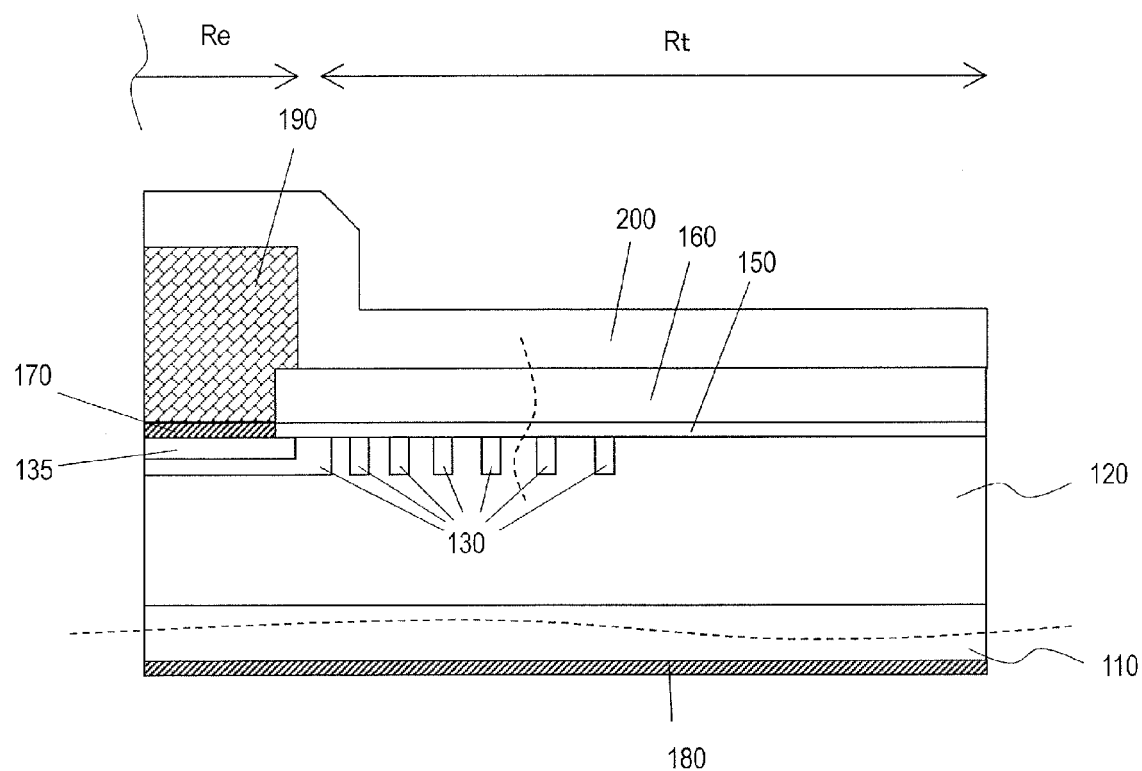
[FIG. 1A] A cross-sectional view illustrating the terminal structure of a silicon carbide semiconductor device that was inspected by the present inventors.
Figure 1B:
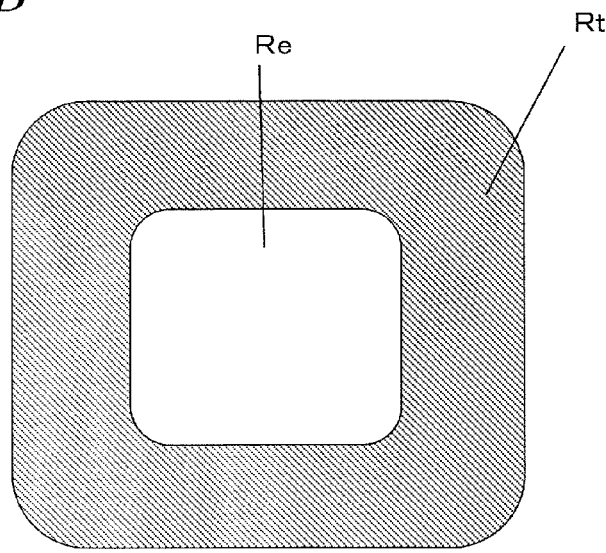
[FIG. 1B] A plan view illustrating the arrangement of an element region and a terminal region in the silicon carbide semiconductor device shown in FIG. 1A.

FIG. 1A is a cross-sectional view illustrating the terminal structure of a silicon carbide semiconductor device that was inspected by the present inventors. This silicon carbide semiconductor device includes an element region Re and a terminal region Rt. As shown in FIG. 1B, the terminal region Rt is arranged to surround the element region Re when viewed perpendicularly to the surface of the substrate.

The silicon carbide semiconductor device includes an $n^+$-type substrate 110 and an $n^-$ layer 120 arranged on the substrate 110. In the surface region of the $n^-$ layer 120, there is a ring region 130 including a p-type dopant. The ring region 130 has a terminal structure that is called an "FLR structure". When viewed perpendicularly to the surface of the $n^-$ layer 120, the ring region 130 includes multiple rings that are spaced apart from each other and surrounds the element region Re in which semiconductor elements are formed. In this description, the superscript "+" and "−" on the right shoulder of the conductivity type n or p indicate the relative concentrations of a dopant. Specifically, "$n^+$" indicates that the n-type dopant concentration is higher than "n" and "$n^-$" indicates that the n-type dopant concentration is lower than "n".

In the element region Re, a p-type contact layer 135 has been formed so as to be located above the ring region 130. Both of the ring region 130 and p-type contact layer 135 have been formed by implanting Al (aluminum) or B (boron) ions.

A p-side contact electrode 170 has been formed on the p-type contact layer 135. And a back surface electrode 180 has been formed on the back surface of the SiC substrate 110.

In the upper part of the $n^-$ layer 120, an oxide film 150 has been formed by thermally oxidizing the $n^-$ layer 120. An interlevel dielectric film 160 has been formed thereon. An line 190 of Al has been formed on the p-type contact electrode 170. And a passivation film 200 has been formed on the interlevel dielectric film 160 and the line 190.

Hereinafter, an exemplary method for fabricating the semiconductor device shown in FIGS. 1A and 1B will be described with reference to FIG. 2(a) through 2(j). In the following description, it will be described just as an example how to fabricate a metal-oxide-semiconductor field effect transistor (which will be referred to herein as an "MOSFET"), which is a kind of a metal-insulator-semiconductor field effect transistor (which will be referred to herein as an "MISFET"), in the element region Re of the semiconductor device.

Figure 2:
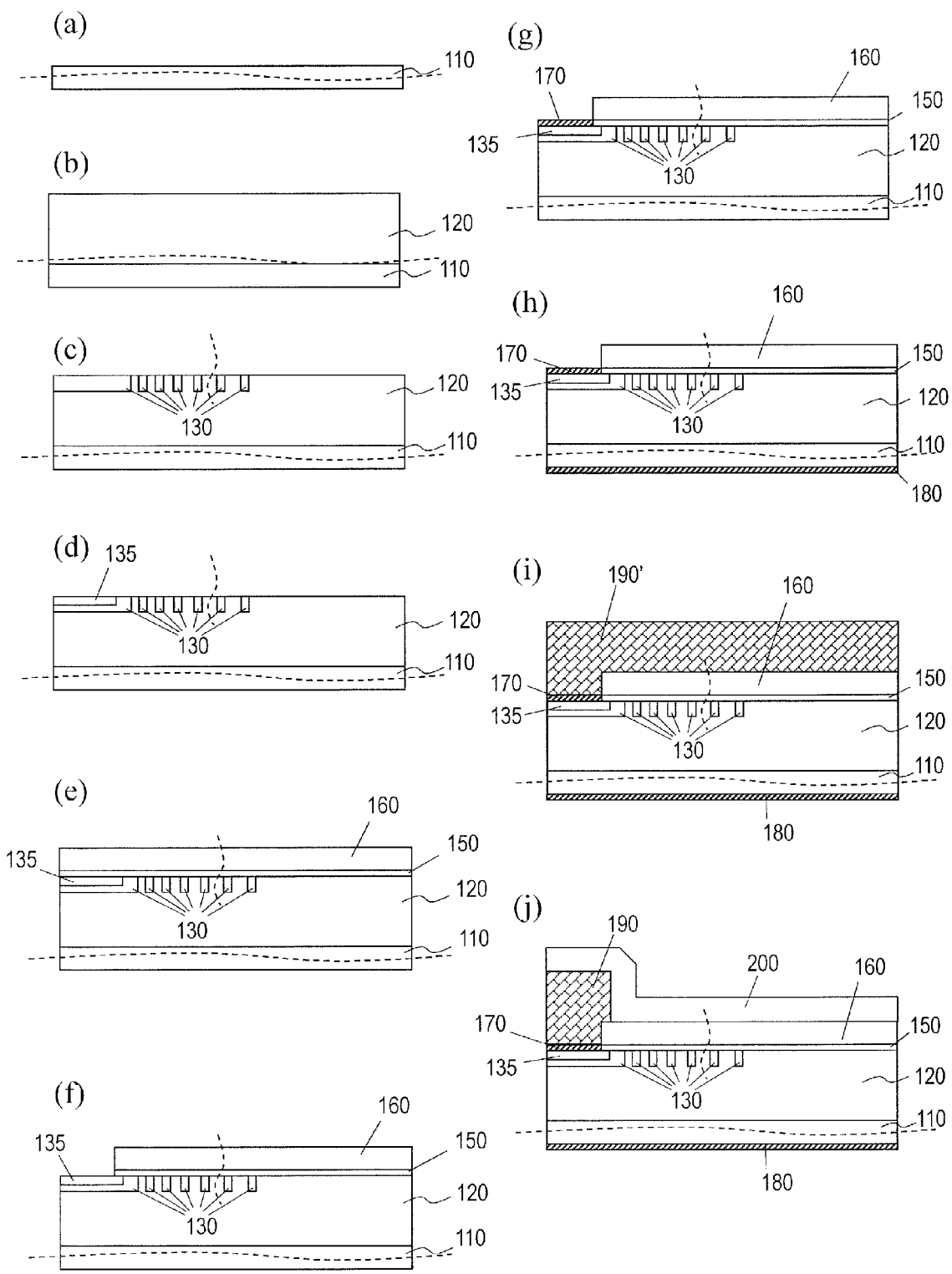
[FIG. 2] (a) through (j) are cross-sectional views illustrating respective manufacturing process steps to fabricate the semiconductor device shown in FIG. 1.

First of all, as shown in FIG. 2(a), a low-resistance n-type SiC substrate 110 is provided. Next, as shown in FIG. 2(b), an $n^-$ layer 120 of $n^-$-type SiC with high resistance is grown epitaxially on the substrate 110.

Next, as shown in FIG. 2(c), Al or B ions, for example, are selectively implanted through a mask (not shown) which has been formed on the $n^-$ layer 120, thereby forming a ring region 130. Subsequently, ions of an n-type or p-type dopant are selectively implanted to define a source region (not shown) in the element region Re. Thereafter, as shown in FIG. 2(d), a mask (not shown) is formed on the ring region 130 and Al or B ions, for example, are selectively implanted through it, thereby forming a p-type contact layer 135 inside of the ring region 130 in the element region Re. After the ion implantation process is finished, the mask is removed and an annealing process is carried out to activate the dopants.

Next, by performing a thermal oxidation process, a thermal oxide film 150 is formed on the surface of the $n^-$ layer 120 as shown in FIG. 2(e). Thereafter, polysilicon (not shown) doped with phosphorus at a dose of about $7.0 \times 10^{20}$ cm$^{-3}$ is deposited on the surface of the thermal oxide film 150. Then, by dry-etching away a portion of the polysilicon thin film through a mask (not shown), a gate electrode (not shown) is formed in a target region. Subsequently, an interlevel dielectric film 160 of $SiO_2$ is deposited by CVD process to a thickness of 1.5 μm to cover the surface of the gate electrode (not shown) and the surface of the $n^-$ layer 120.

Next, by performing a dry etching process using a mask (not shown), a portion of the interlevel dielectric film 160 over the p-type contact layer 135 is removed to cut a hole there as shown in FIG. 2(f). After that, a nickel thin film is deposited to a thickness of about 50 nm inside the hole that has been cut through the interlevel dielectric film 160. Subsequently, a heat treatment is carried out at 950° C. for five minutes within an inert ambient, thereby causing nickel to react with silicon carbide that is exposed inside the hole. Thereafter, by removing an unreacted portion of the nickel thin film, a p-side contact electrode 170 of nickel silicide is formed. In this process step, a source contact electrode (not shown) is formed in the element region Re at the same time. Furthermore, as shown in FIG. 2(h), a nickel thin film is also deposited over the entire back surface of the substrate 110 and nickel is made to react with silicon carbide in the substrate 110 through the heat treatment described above, thereby forming a back surface electrode 180.

Subsequently, as shown in FIG. 2(i), aluminum 190' is deposited to a thickness of about 4 μm over the interlevel dielectric film 160. And by etching that aluminum 190' into an intended pattern, a source line 190 can be obtained as shown in FIG. 2(j). In this process step, a gate line (not shown) which contacts with the gate electrode is formed at the end of the chip. Thereafter, an SiN film is deposited to a thickness of approximately 1 μm and then etched into an intended pattern, thereby forming a passivation film 200. By performing these process steps, the semiconductor device shown in FIG. 1A can be obtained.

As a result of the intensive experiments, the present inventors discovered that the breakdown voltage in OFF state decreased due to a partial loss of the surface of the $n^-$ layer 120 during the manufacturing process before the structure shown in FIG. 2(e) was obtained.

Hereinafter, it will be described in detail how the present inventors reached this conclusion based on the results of breakdown voltage calculations that had been carried out through TCAD (technology computer aided design) process/device simulations. The breakdown voltages are calculated in the following manner. First of all, by solving the Poisson formula and the electron-hole current continuity equation through TCAD device simulations, electric charge and an electric field distribution when a voltage is applied to between the p-side contact electrode 170 and the back surface electrode 180 are obtained. Next, an impact ionization coefficient that determines the breakdown voltage is set. The impact ionization coefficient is a parameter that depends on the semiconductor material. In this case, in SiC, the impact ionization coefficient is supposed to be constant anywhere (i.e., the semiconductor material is supposed to be never affected by any deterioration in crystallinity involved with an ion implantation). And based the electric field distribution and the impact ionization coefficient described above, the distribution of electron-hole pair generation rates is calculated and the breakdown voltage of the semiconductor device is determined. It should be noted that the breakdown voltage of the semiconductor device is determined to be a voltage at which no avalanche breakdown is caused by generation of electron-hole pairs.

Figure 3:
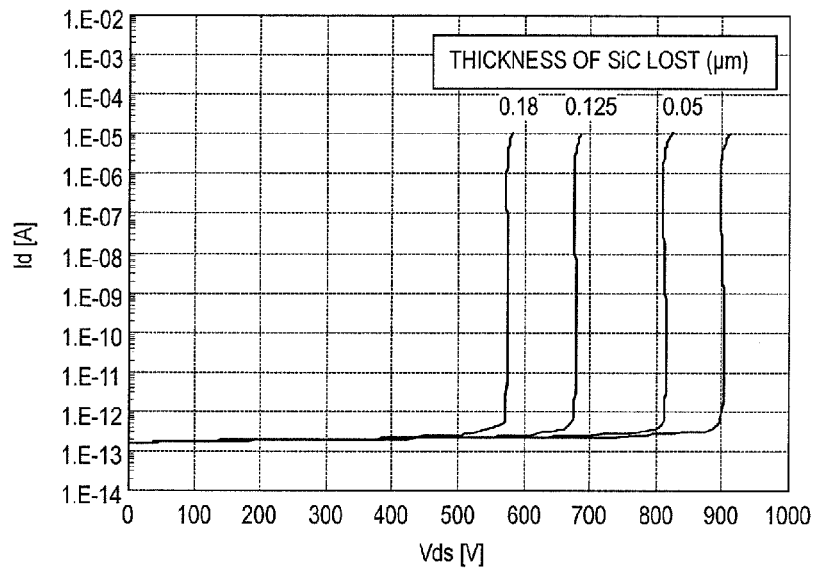
[FIG. 3] A graph showing the breakdown voltages that were calculated by carrying out TCAD process/device simulations.

FIG. 3 shows the breakdown voltages that were calculated by carrying out TCAD simulations on a structure, of which the SiC surface had been lost. When the simulations were carried out, the dopant concentration of the n− layer 120 was supposed to be $1.2 \times 10^{16}$ cm$^{-3}$ and its thickness was supposed to be 10 μm. Also, the thicknesses of the lost portion were set to be 0 (not lost), 0.05, 0.125 and 0.18 μm. As can be seen from FIG. 3, the present inventors discovered that even in an FLR structure that would achieve a breakdown voltage of approximately 900 V without the loss, its breakdown voltage decreased by approximately 100 V every time the SiC surface was lost by 0.05 μm. Based on the results of experiments, the present inventors concluded that when the SiC surface was lost, the surface portion of the ring region 130 was also lost and the depth of the bottom of the ring region 130 decreased, thus getting the electric field that should have been dispersed by the ring region 130 overconcentrated in a structure such as the element region without being dispersed.

The surface of the n− layer 120 could be lost by performing a thermal oxidation process to clean the surface of the n− layer 120 and by removing an oxide film produced, or by performing an annealing process to activate the dopants that have been introduced by ion implantation, or by performing excessive over-etching while a thin film structure that has been formed on the n− layer 120 is being dry-etched.

In addition, the present inventors also discovered and confirmed via experiments that SiC could also be lost from the surface of an SiC semiconductor even if such an activating annealing process was carried out at an appropriate temperature setting during the manufacturing process. On the other hand, in an Si semiconductor device, if the activating annealing process is carried out at an appropriate temperature setting during the manufacturing process, its Si semiconductor layer would not ordinarily be lost. That is why such deterioration in breakdown voltage characteristic due to the loss of SiC from the surface during the manufacturing process should be a problem unique to an SiC semiconductor device.

If the partial loss of the surface of the SiC semiconductor layer can be sufficiently controlled and if the rate of the loss is always constant, the terminal structure may be designed with the rate of the loss taken into account in advance. However, if the rate of the loss changes from one wafer to another, or varies from one location to another even on the same wafer, due to some constraints imposed on the manufacturing equipment, then a significant dispersion distribution will be caused in the breakdown voltage of the semiconductor device being fabricated. Thus, to overcome these problems, the present inventors invented a novel semiconductor device and a method for fabricating such a semiconductor device. Embodiments of the present invention can be outlined as follows.

A semiconductor device according to an aspect of the present invention includes a silicon carbide layer of a first conductivity type which has a first principal surface and a second principal surface and which includes an element region and a terminal region that surrounds the element region on the first principal surface. The silicon carbide layer includes a first dopant layer of the first conductivity type which contacts with the first principal surface and a second dopant layer of the first conductivity type which is located closer to the second principal surface than the first dopant layer is. The terminal region has, in its surface portion with a predetermined depth as measured from the first principal surface, a terminal structure which includes a portion of the first dopant layer, a portion of the second dopant layer, and a ring region of a second conductivity type that runs through the first dopant layer to reach the second dopant layer. The dopant concentration of the first dopant layer is twice to five times as high as the dopant concentration of the second dopant layer. And when viewed along a normal to the first principal surface, the first dopant layer is arranged to contact with the ring region both inside and outside of the region.

The silicon carbide layer may further include, between the first and second dopant layers, a third dopant layer of the first conductivity type which has a lower dopant concentration than the second dopant layer, and the ring region may run through the third dopant layer.

The ring region may include a heavily doped ring region which contacts with the first principal surface of the silicon carbide layer and a lightly doped ring region which contacts with the bottom of the ring region. The heavily doped ring region may be thicker than the first dopant layer. And the second conductivity type dopant concentration of the heavily doped ring region may be twice or more as high as the second conductivity type dopant concentration of the lightly doped ring region.

The ring region may include a heavily doped ring region which contacts with the first principal surface of the silicon carbide layer and a lightly doped ring region which contacts with the bottom of the ring region. The heavily doped ring region may be thicker than the first dopant layer. The third dopant layer may contact with the heavily doped ring region and the lightly doped ring region. And the second conductivity type dopant concentration of the heavily doped ring region may be twice or more as high as the second conductivity type dopant concentration of the lightly doped ring region.

The terminal structure may be a field limited ring structure.

The terminal structure may be a junction termination extension structure.

The semiconductor device may further include a metal-insulator-semiconductor field effect transistor, at least a part of which is provided in the element region of the silicon carbide layer.

The semiconductor device may further include an insulated gate bipolar transistor, at least a part of which is provided in the element region of the silicon carbide layer.

The semiconductor device may further include a PN junction diode, at least a part of which is provided in the element region of the silicon carbide layer.

The semiconductor device may further include a Schottky barrier diode, at least a part of which is provided in the element region of the silicon carbide layer.

The semiconductor device may further include a junction field effect transistor, at least a part of which is provided in the element region of the silicon carbide layer.

A semiconductor device fabricating method according to another aspect of the present invention is a method for fabricating a semiconductor device with a silicon carbide layer of a first conductivity type which has a first principal surface and a second principal surface and which includes an element region and a terminal region that surrounds the element region on the first principal surface. The method includes the steps of: (a) forming a silicon carbide layer which includes a first dopant layer of the first conductivity type that contacts with the first principal surface and a second dopant layer of the first conductivity type that is located closer to the second principal surface than the first principal surface; (b) forming, in the silicon carbide layer, a terminal structure which includes a ring region of a second conductivity type that runs through the first dopant layer to reach the second dopant layer; and (c) forming an insulating layer on the first principal surface of the silicon carbide layer. The dopant concentration of the first dopant layer is twice to five times as high as the dopant concentration of the second dopant layer. And when viewed along a normal to the first principal surface, the first dopant layer is arranged to contact with the ring region both inside and outside of the region.

The step (a) of forming a silicon carbide layer may include forming, between the first and second dopant layers, a third dopant layer of the first conductivity type.

The step (b) may include forming, using the same mask, a heavily doped ring region which contacts with the first principal surface of the silicon carbide layer and a lightly doped ring region which contacts with the second dopant layer at the bottom of the ring region.

Hereinafter, embodiments of a semiconductor device and method for fabricating the device according to the present invention will be described with reference to the accompanying drawings. It should be noted that embodiments to be described below are just an example of the present invention and the present invention is no way limited to those embodiments.

(Embodiment 1)

Figure 4:
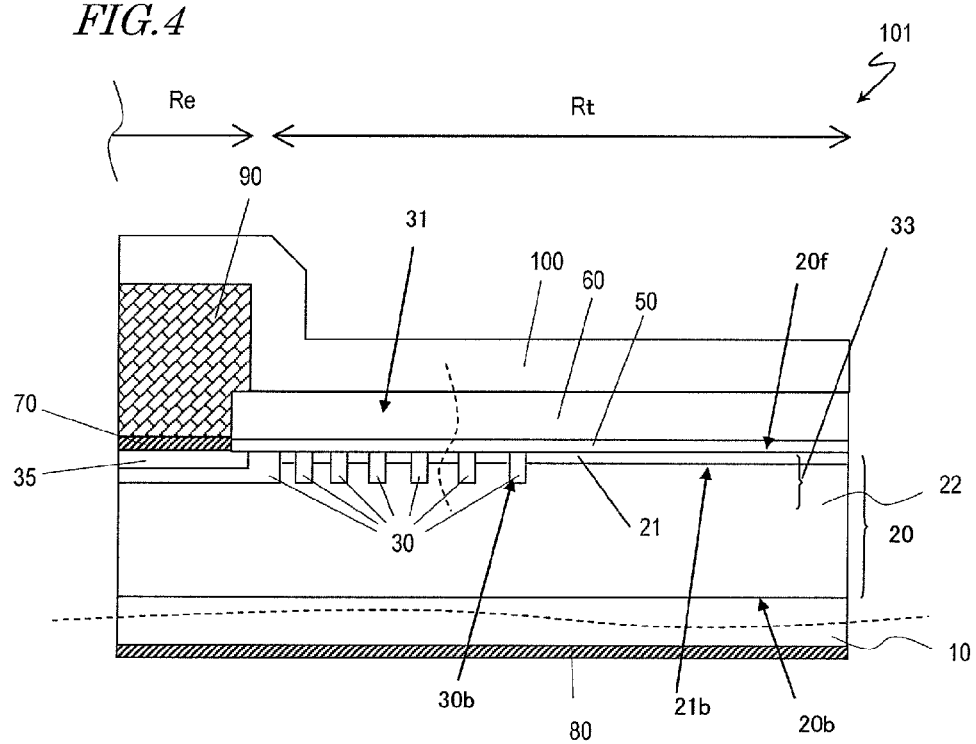
[FIG. 4] A cross-sectional view schematically illustrating a semiconductor device according to a first embodiment.

FIG. 4 is a cross-sectional view schematically illustrating a first embodiment of a semiconductor device according to the present invention. As shown in FIG. 4, the semiconductor device 101 of this embodiment includes a substrate 10 and a silicon carbide layer 20 which has been formed on the substrate 10. The substrate 10 supports the silicon carbide layer 20 and may be made of $n^+$-type SiC, for example.

This semiconductor device 101 has an element region Re and a terminal region Rt. As in the comparative example that has already been described with reference to FIG. 1B, when viewed perpendicularly to the principal surface of the substrate 10, the terminal region Rt also surrounds the element region Re.

In the example to be described below, a terminal structure 31 is supposed to be provided as an FLR structure in the terminal region Rt of the semiconductor device 101 and an MISFET is supposed to be provided in the element region Re. Examples of semiconductor elements to be provided in the element region include a PN diode, a Schottky barrier diode, an insulated gate bipolar transistor (which will be referred to herein as "IGBT") and a junction field effect transistor (which will be referred to herein as "JFET").

In the element region Re, a portion of the semiconductor element is provided in the silicon carbide layer 20. In the terminal region Rt, on the other hand, the entire FLR structure is provided in the silicon carbide layer 20.

The silicon carbide layer 20 has a first principal surface 20f that is its surface and a second principal surface 20b that is its back surface. Also, the silicon carbide layer 20 includes an $n^+$ layer 21 (as a first dopant layer) which contacts with the first principal surface 20f and an $n^-$ layer (as a second dopant layer) which is located closer to the second principal surface 20b than the $n^+$ layer 21 is. In the example illustrated in FIG. 4, the rest of the silicon carbide layer 20 other than the $n^+$ layer 21 is the $n^-$ layer 22 and the $n^+$ layer 21 and the $n^-$ layer 22 contact with each other. The n-type dopant concentration of the $n^+$ layer 21 is twice to five times as high as that of the $n^-$ layer 22. The silicon carbide layer 20 including the $n^+$ and $n^-$ layers 21 and 22 may be formed on the substrate 10 by some epitaxial growing method such as a CVD process, for example. Consequently, the variation in dopant concentration in the depth direction can be reduced, and the boundary between the $n^+$ and $n^-$ layers 21 and 22 and the respective dopant concentrations of the $n^+$ and $n^-$ layers 21 and 22 can be determined by measuring the dopant concentration profile. As long as the boundary between the $n^+$ and $n^-$ layers 21 and 22 is arranged over the bottom of the ring region 30 to be described below, the effect of reducing dispersion in breakdown voltage between the semiconductor devices 101 can be achieved. However, the boundary may be set to be approximately level with the thickness of SiC to be lost. Since the dopant concentration of the $n^+$ layer 21 is higher than that of the $n^-$ layer 22, the dopant concentration of the $n^+$ layer 21 may be set to be twice to five times as high as that of the $n^-$ layer 22 to minimize a decrease in breakdown voltage due to decreased extension of a depletion layer. In the following description, the boundary layer between the $n^+$ and $n^-$ layers 21 and 22 will be sometimes referred to herein as the "bottom 21b of the $n^+$ layer 21". The $n^+$ layer 21 may have a dopant concentration of approximately $5 \times 10^{16}$ cm$^{-3}$ and a thickness of 0.2 μm, for example.

Alternatively, the $n^+$ layer 21 may also be formed by either implanting or diffusing an n-type dopant into the silicon carbide layer 20 that has been grown epitaxially. In that case, the boundary between the $n^+$ layer 21 and the $n^-$ layer 22 and the respective dopant concentrations of the $n^+$ layer 21 and the $n^-$ layer 22 may be determined in accordance with the definition of the ring region's dopant concentration to be described later for the second embodiment.

The terminal structure 31 is provided in the terminal region Rt of the silicon carbide layer 20 and in the surface portion 33 that has a predetermined depth as measured the first principal surface 20f.

Specifically, the terminal structure 31 includes a portion of the $n^+$ layer 21 which is located in the surface portion 33, a portion of the $n^-$ layer 22 which is located under the $n^+$ layer 21 in the surface portion 33, and one or more p-type ring regions 30 that are provided in the surface portion 33 to run through the $n^+$ layer 21 to reach the $n^-$ layer 22. That is why when viewed along a normal to the first principal surface 20f, the $n^+$ layer 21 is located to contact with every ring region 30 inside and outside of the region. In this description, if something is located "inside of" something else, the former is located closer to the element region than the latter. On the other hand, if something is located "outside of" something else, the former is located opposite from the element region. The bottom 30b of each ring region 30 is located closer to the second principal surface 20b than the bottom 21b of the $n^+$ layer 21 is. It should be noted that the bottom 30b of the ring region 30 has its boundary defined to be a depth reaching the lower detection limit of a major one of the constituent elements of the ring region 30 in the composition analysis of the ring region 30 with an SIMS (secondary ion mass spectrometer).

When viewed perpendicularly to the first principal surface 20f, the ring regions 30 are comprised of multiple rings that are spaced apart from each other and together form an FLR structure. Each of those ring regions 30 may have a square ring shape with four rounded corners on the first principal surface 20f. By rounding the four corners of each ring, it is possible to prevent an electric field from getting overconcentrated at those four corners.

In the element region Re, there is a p-well region (not shown) for an MISFET. Inside that well region, a p-type contact layer 35 having a higher p-type dopant concentration (e.g., $2 \times 10^{20}$ cm$^{-3}$) than the ring regions 30 has been formed. The ring regions 30, the p-well region and the p-type contact layer 35 have been formed by implanting ions of Al (aluminum) or B (boron) into the silicon carbide layer 20. The p-type contact layer 35 is covered with a p-side contact electrode 70 of nickel silicide. Inside the p-well region, a source region (not shown) with an n-type dopant concentration of $5 \times 10^{19}$ cm$^{-3}$, for example, has been formed. Although not shown, the source region is arranged so as to surround the p− type contact layer 35 when viewed perpendicularly to the first principal surface 20f of the silicon carbide layer 20.

In the terminal region Rt, an oxide film 50 which has been formed by thermally oxidizing the n$^+$ layer 21 is arranged over the n$^+$ layer 21. The oxide film 50 may have a thickness of 70 nm, for example. In the element region Re, the oxide film 50 functions as a gate insulating film. On the oxide film 50 in the element region Re, arranged is a gate electrode (not shown) of polysilicon, for example.

The oxide film 50 and the gate electrode are covered with an interlevel dielectric film 60 of SiO$_2$, for example. In the element region Re, a through hole that reaches the p-side contact electrode 70 has been cut through the interlevel dielectric film 60. A source line 90 of Al has been formed inside the through hole, and has been extended onto the interlevel dielectric film 60.

A back surface electrode 80 has been formed on the back surface of the substrate 10. A passivation film 100 has been formed on the interlevel dielectric film 60 and the source line 90.

Hereinafter, an exemplary method for fabricating a semiconductor device according to this embodiment will be described with reference to FIG. 5(a) through 5(j), in which illustration of the principal portion of the element region Re is omitted and only the terminal region Rt and its surrounding region are illustrated.

Figure 5:
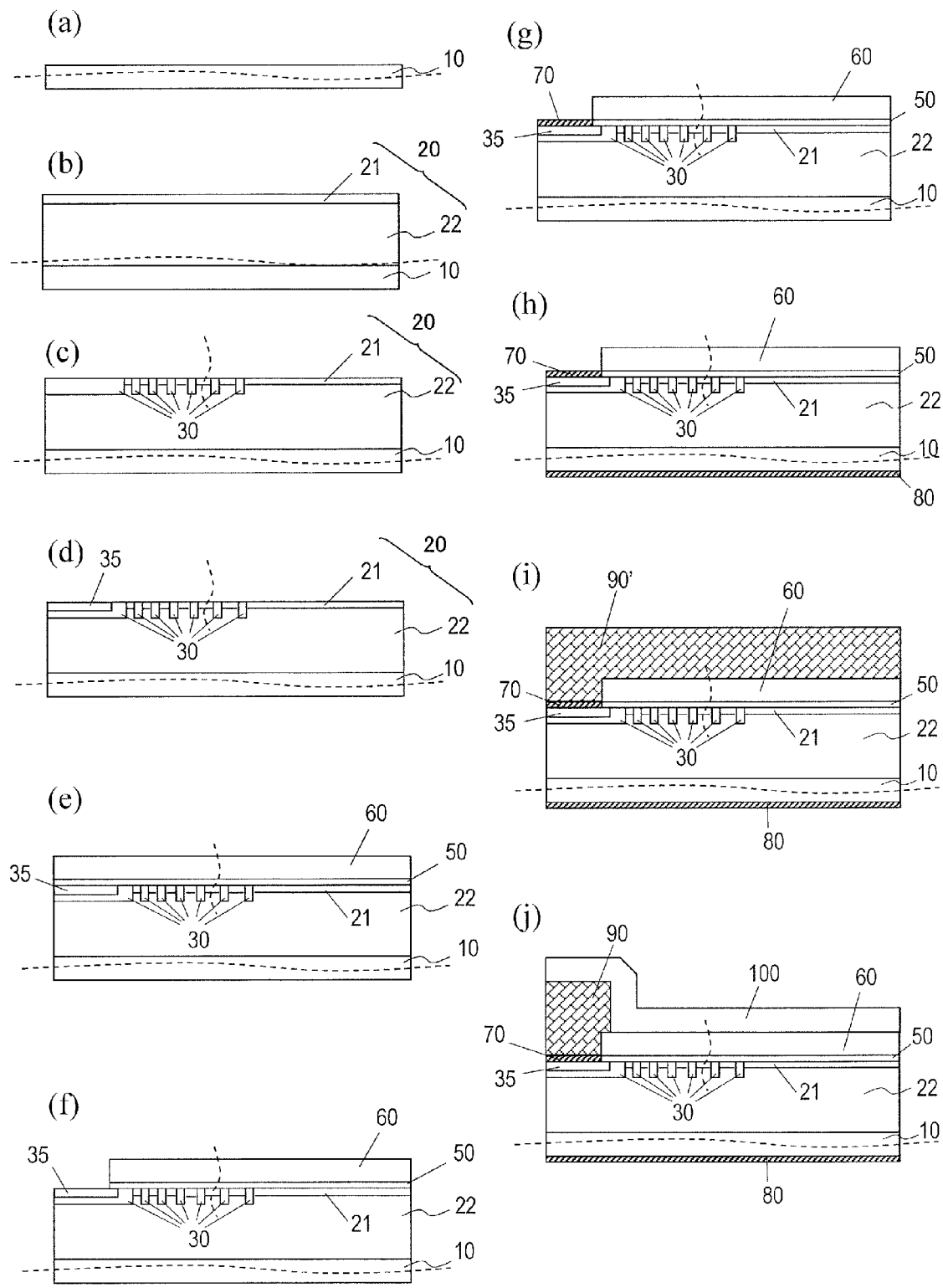
[FIG. 5] (a) through (j) are cross-sectional views illustrating respective manufacturing process steps to fabricate the semiconductor device of the first embodiment.

First of all, as shown in FIG. 5(a), a low-resistance n-type SiC substrate 10 is provided. Next, as shown in FIG. 5(b), an n$^−$ layer 22 of n$^−$-type SiC with high resistance is grown epitaxially on the substrate 10. And then an n$^+$ layer 21 of n$^+$-type heavily doped SiC is further grown epitaxially on the surface of the n$^−$ layer 22. The n$^+$ layer 21 does not have to be grown epitaxially but may also be formed by implanting ions of N (nitrogen) or P (phosphorus) into the surface portion of the n$^−$ layer 22. As a result, a silicon carbide layer 20 including the n$^+$ layer 21 and the n$^−$ layer 22 is formed on the substrate 10.

Next, as shown in FIG. 5(c), Al or B ions, for example, are selectively implanted into the silicon carbide layer 20 through a mask (not shown), thereby forming ring regions 30 and a p-well region (not shown). Subsequently, ions of N (nitrogen) or P (phosphorus) are selectively implanted into the silicon carbide layer 20 to define a source region.

Thereafter, as shown in FIG. 5(d), a mask (not shown) is formed on the ring regions 130 and Al or B ions, for example, are selectively implanted through it, thereby forming a p-type contact layer 135 inside of the p-well region in the element region Re. After the ion implantation process is finished, the mask is removed and an annealing process is carried out at a temperature of 1700° C., for example, to activate the dopants.

Next, by performing a thermal oxidation process at a temperature of 1200° C., for example, a thermal oxide film 50 is formed on the surface of the n$^+$ layer 21 as shown in FIG. 5(e). Thereafter, polysilicon (not shown) doped with phosphorus at a dose of about $7.0 \times 10^{20}$ cm$^{-3}$ is deposited on the surface of the thermal oxide film 50. Then, by dry-etching away a portion of the polysilicon thin film through a mask (not shown), a gate electrode (not shown) is formed in a target region. Subsequently, an interlevel dielectric film 60 of SiO$_2$ is deposited by CVD process to a thickness of 1.5 μm, for example, to cover the surface of the gate electrode and the surface of the silicon carbide layer 20.

Next, by performing a dry etching process using a mask (not shown), a portion of the interlevel dielectric film 60 where a contact electrode 70 (shown in FIG. 5(g)) is going to be formed is removed to cut a hole there as shown in FIG. 5(f). After that, a nickel thin film is deposited as shown in FIG. 5(g) to a thickness of about 50 nm inside the hole that has been cut through the interlevel dielectric film 60. Subsequently, a heat treatment is carried out at 950° C. for five minutes within an inert ambient, thereby causing nickel to react with silicon carbide that is exposed inside the hole. Thereafter, by removing an unreacted portion of the nickel thin film, a p-side contact electrode 70 of nickel silicide is formed. In this process step, a source contact electrode (not shown) may also be formed at the same time. Furthermore, as shown in FIG. 5(h), nickel is also deposited over the entire back surface of the substrate 10 and made to react with silicon carbide through the heat treatment described above, thereby forming a back surface electrode 80.

Subsequently, as shown in FIG. 5(i), aluminum 90' is deposited to a thickness of about 4 μm over the interlevel dielectric film 60. And by etching that aluminum 90' into an intended pattern, a line 90 can be obtained as shown in FIG. 5(j). In this process step, a gate line (not shown) which contacts with the gate electrode is also formed at the end of the chip. Thereafter, an SiN film is deposited to a thickness of approximately 1 μm and then etched into an intended pattern, thereby forming a passivation film 100. By performing these process steps, the semiconductor device 101 shown in FIG. 4 can be obtained.

Figure 6:
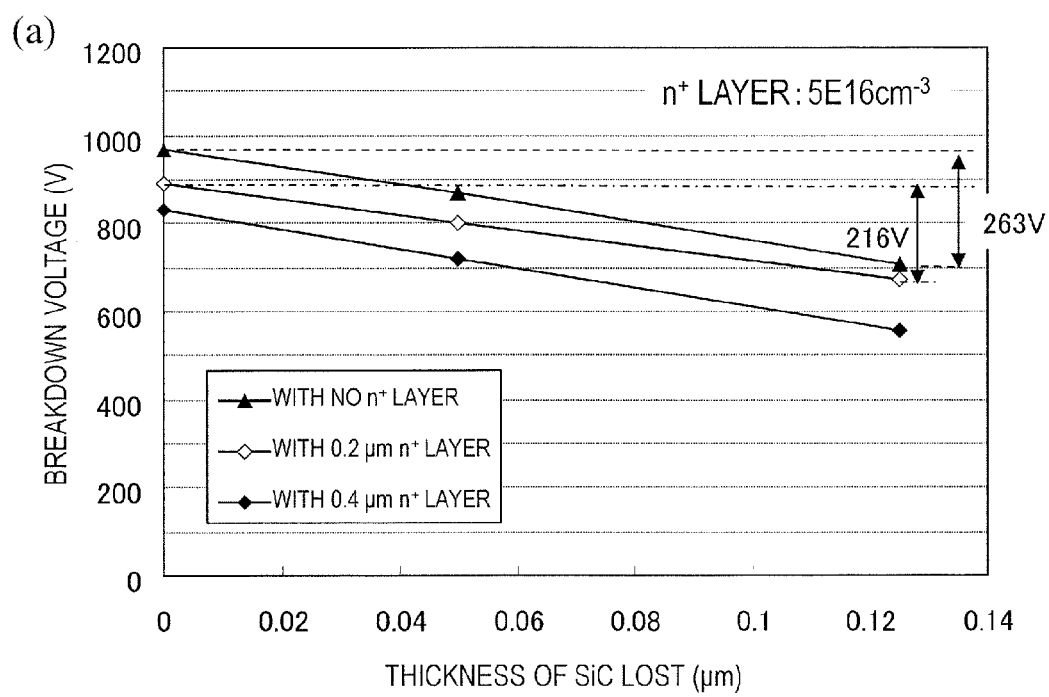
[FIGS. 6] (a) and (b) show the results of computations that were made to determine the dopant concentration and thickness of a heavily doped $n^+$ layer arranged on the surface of the semiconductor device according to the first embodiment.
Figure 6:
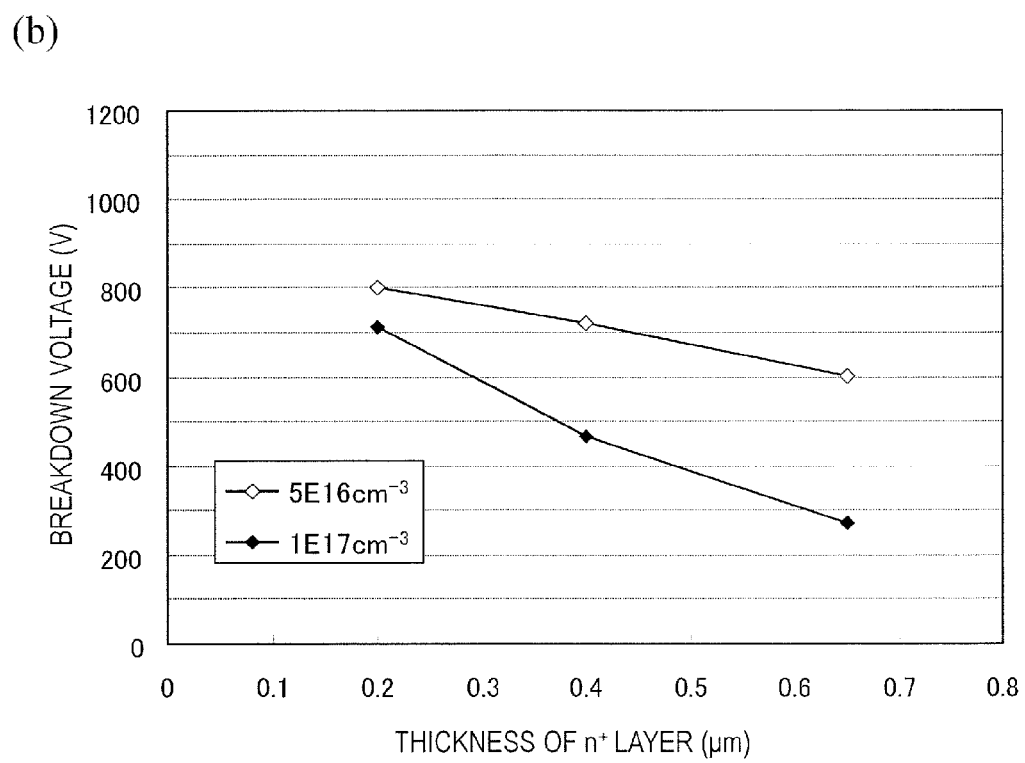

FIGS. 6(a) and 6(b) show the results of computations that were made to simulate the influence of the dopant concentration and thickness of the n$^+$ layer 21 on the breakdown voltage by TCAD simulations. In making the simulations shown in FIG. 6(a), breakdown voltages when the thicknesses of the lost portion of the silicon carbide layer were set to be 0 (not lost), 0.05 and 0.125 μm, respectively, were obtained. The breakdown voltage value (Vbd) was supposed to be a voltage value when the drain current (Id) was $1 \times 10^{-10}$ A. As shown in FIG. 6(a), if SiC with a thickness of 0.125 μm was lost from the surface of a structure without the n$^+$ layer 21, the breakdown voltage decreased by 263 V. On the other hand, in a situation where the n$^+$ layer 21 had a dopant concentration of $5 \times 10^{16}$ cm$^{-3}$ and a thickness of 0.2 μm, even if SiC with a thickness of 0.125 μm was lost from the surface, the breakdown voltage decreased by no more than 216 V.

Also, as can be seen from FIG. 6(b), the thicker the n$^+$ layer 21, the smaller (the initial value of) the breakdown voltage. For that reason, the thickness of the n$^+$ layer 21 is set to be not too large compared to the thickness of a portion of SiC to be lost from the surface. On the other hand, if the dopant concentration of the n$^+$ layer 21 is $1 \times 10^{17}$ cm$^{-3}$, the depletion layer does not expand sufficiently to cause a decrease in breakdown voltage.

As described above, an appropriate thickness and an appropriate dopant concentration of the n$^+$ layer 21 depend on the size of the depletion layer expanding in the n$^+$ and n$^−$ layers 21 and 22 and the thickness of a portion of SiC to be lost. The present inventors discovered via intensive experiments that when the dopant concentration of the n$^+$ layer 21 was twice to five times as high as that of the n$^−$ layer 22 and when the thickness of the n$^+$ layer 21 fell within the range of 0.1 μm to 0.2 μm, the decrease in breakdown voltage could be limited effectively.

In addition, by setting the dopant concentration and thickness of the n$^−$ layer 22 appropriately, the breakdown voltage in OFF state can also be maintained even if the depletion layer cannot expand easily around the n+ layer 21 due to the presence of the heavily doped n+ layer 21 on the surface of the silicon carbide layer 20. For example, the dopant concentration of the n− layer 22 may be set to be $1 \times 10^{16}$ cm$^{-3}$ and its thickness may be set to be 10 μm.

As can be seen, in the semiconductor device of this embodiment, the n+ layer 21 is provided on the surface of the silicon carbide layer 20. Thus, even if some SiC is lost from the surface of the silicon carbide layer 20 during the manufacturing process, the dispersion in breakdown voltage to be caused according to the thickness of that lost portion of SiC can be minimized.

Particularly, if the FLR structure is designed to occupy as small an area on the chip as possible and eventually cut down the overall chip area, the FLR structure is designed to achieve a target breakdown voltage with the depletion layer allowed to reach a region including the outermost ring region. If the n+ layer is arranged only one side of the outermost ring region so as to be located closer to the element region, the effect of reducing the overconcentration of the electric field in the vicinity of the surface of silicon carbide cannot be achieved outside of the outermost ring region. As a result, the dispersion in a decrease in breakdown voltage to be caused when a portion of the surface of silicon carbide is lost cannot be reduced in that region.

On the other hand, according to this embodiment, the n+ layer that is the first dopant layer is arranged both inside and outside of each and every ring region including that outermost ring region. As a result, the effect of reducing dispersion in a decrease in breakdown voltage in a situation where a portion of the surface of the silicon carbide layer is lost as described above can be ensured.

Figure 7:
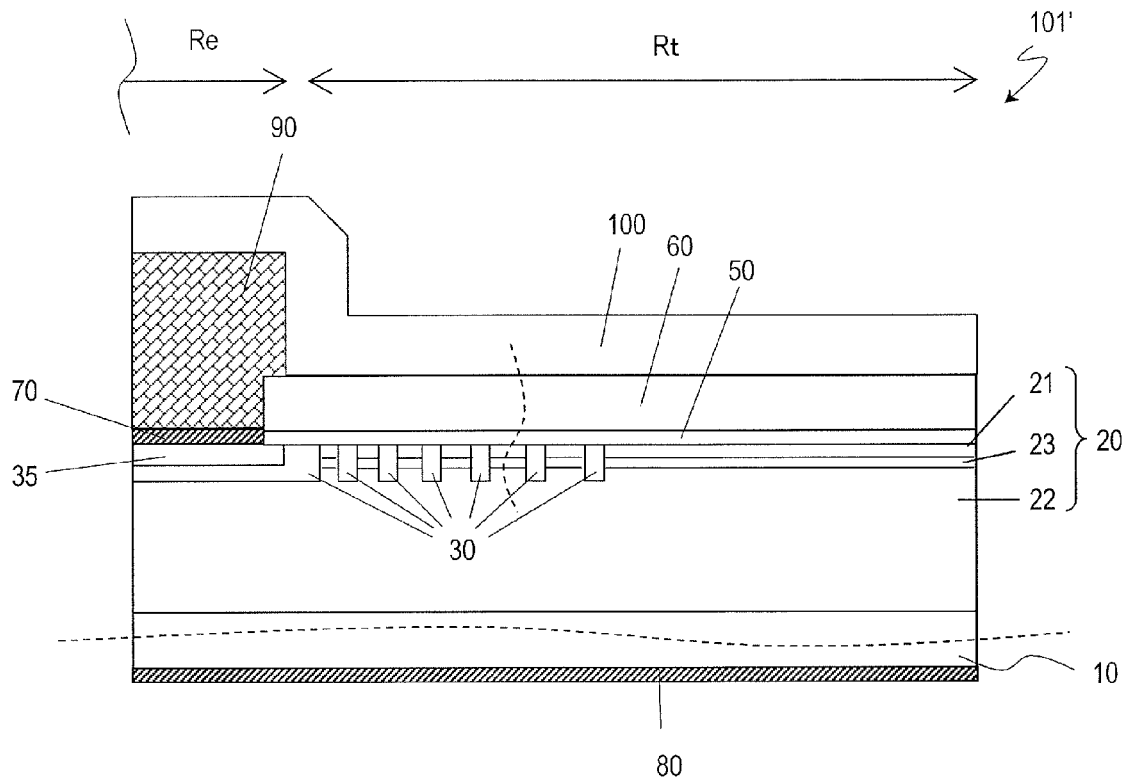
[FIG. 7] A cross-sectional view schematically illustrating a semiconductor device as a modified example of the first embodiment.

FIG. 7 is a cross-sectional view schematically illustrating the structure of a modified example of this embodiment. In the semiconductor device 101' shown in FIG. 7, the silicon carbide layer 20 further includes an n− layer 23 (that is a third dopant layer) between the n+ layer 21 and the n− layer 22. By epitaxially growing the n− layer 22, the n−− layer 23 and the n+ layer 21 in this order while the silicon carbide layer 20 is being formed on the substrate 10, this semiconductor device 101' can be fabricated in almost the same way as the semiconductor device 101 of the first embodiment described above. As a result, even if the depletion layer cannot expand easily around the n+ layer 21 due to the presence of the heavily doped n+ layer 21 on the surface of the silicon carbide layer 20, the breakdown voltage in OFF state can be maintained sufficiently.

Figure 8:
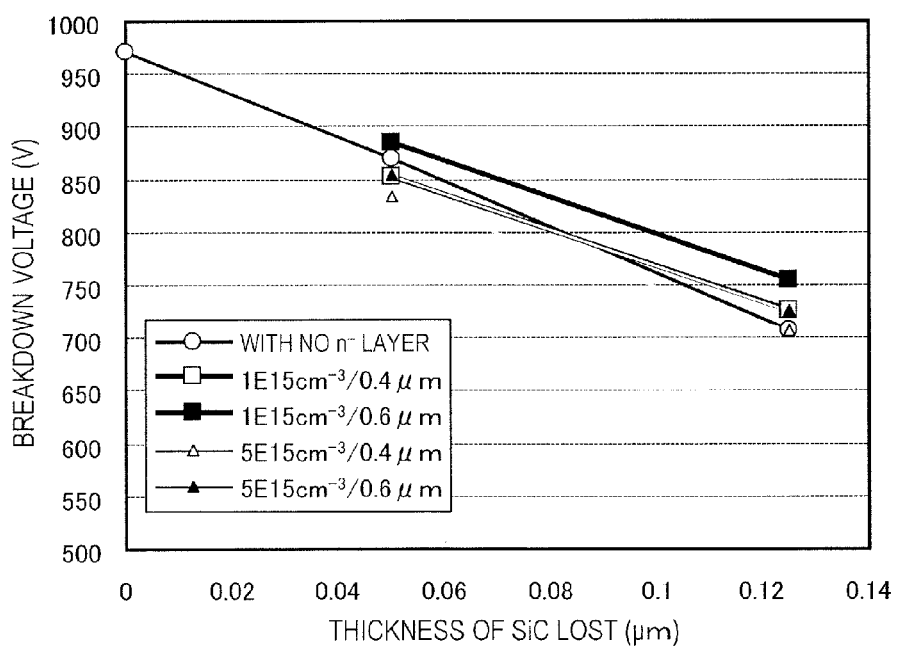
[FIG. 8] Shows the results of computations that were made to determine the dopant concentration and thickness of the $n^-$ layer of the semiconductor device shown in FIG. 7.

FIG. 8 shows the results of computations that were made to simulate the influence of the dopant concentration and thickness of the n− layer 23 on the breakdown voltage by TCAD simulations in a situation where the n+ layer 21 and the n−− layer 23 are provided for the silicon carbide layer 20. The dopant concentration and thickness of the n+ layer 21 were set to be $5 \times 10^{16}$ cm$^{-3}$ and 0.2 μm, respectively. Breakdown voltages when the thicknesses of the lost portion of SiC were set to be 0 (not lost), 0.05 and 0.125 μm, respectively, were obtained.

As can be seen from FIG. 8, by setting the dopant concentration of the n− layer 23 to be lower than that of the n− layer 22 and by setting the thickness of the n− layer 23 to be sufficiently large, the depletion layer to be formed in the silicon carbide layer 20 can be expanded and its breakdown voltage can be increased to and beyond the level of a structure with no n+ layer 21.

In this modified example, the dopant concentration of the n− layer 23 may be set to be $5 \times 10^{15}$ cm$^{-3}$ or less, for example.

The n− layer 23 may be arranged so as to contact with the lower end of the n+ layer 21 and be located over the respective lower ends of the ring regions 30 and the p-well region. That is to say, the ring regions 30 may run through the n+ layer 21 and the n− layer 23 and contact with the n− layer 22. For example, if the lower end of the p-well region arranged in the element region Re and the lower ends of the ring regions 30 are located at the same depth, then the lower end of the n− layer 23 may be shallower than the lower end of the p-well region. Then, an increase in the ON-state resistance of the element can be minimized.

As can be seen, this semiconductor device 101' has a high breakdown voltage and can minimize dispersion in a decrease in breakdown voltage due to the loss of a portion of SiC during the manufacturing process of the semiconductor device.

(Embodiment 2)

Figure 9A:
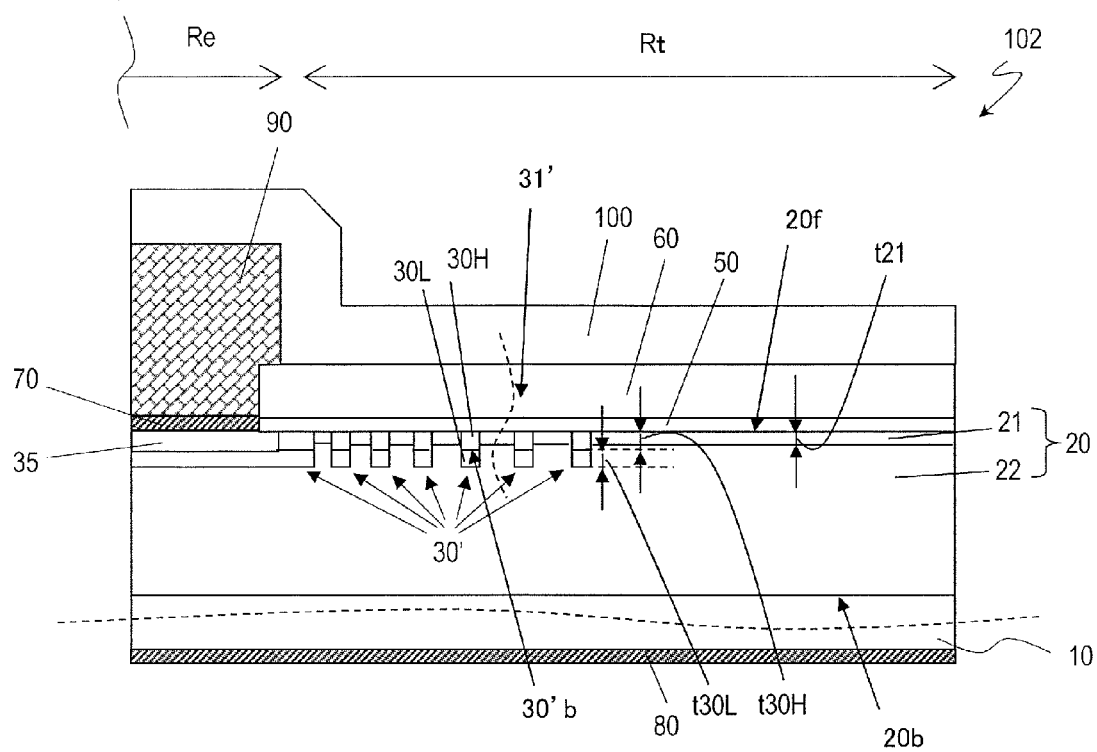
[FIG. 9A] A cross-sectional view schematically illustrating a semiconductor device according to a second embodiment.

A second embodiment of a semiconductor device according to the present invention will be described with reference to FIG. 9A, which is a cross-sectional view schematically illustrating a semiconductor device 102 according to this second embodiment. As shown in FIG. 9A, this semiconductor device 102 includes a terminal structure 31', which is a major difference from the first embodiment. Specifically, the terminal structure 31' includes ring regions 30' with a different structure from their counterparts of the first embodiment.

As shown in FIG. 9A, each ring region 30' includes a heavily doped ring region 30H which contacts with the first principal surface 20f of the silicon carbide layer 20 and a lightly doped ring region 30L which contacts with the bottom 30'b of the heavily doped ring region 30H. The heavily doped and lightly doped ring regions 30H and 30L contact with each other.

When measured perpendicularly to the first principal surface 20f of the silicon carbide layer 20, the thickness t30H of the heavily doped ring region 30H is greater than the thickness t21 of the n+ layer 21. That is to say, the heavily doped ring region 30H runs through the n+ layer 21 and contacts with the n− layer 22. The heavily doped and lightly doped ring regions 30H and 30L are both p-type and the dopant concentration of the heavily doped ring region 30H is twice or more as high as that of the lightly doped ring region 30L.

Figure 9B:
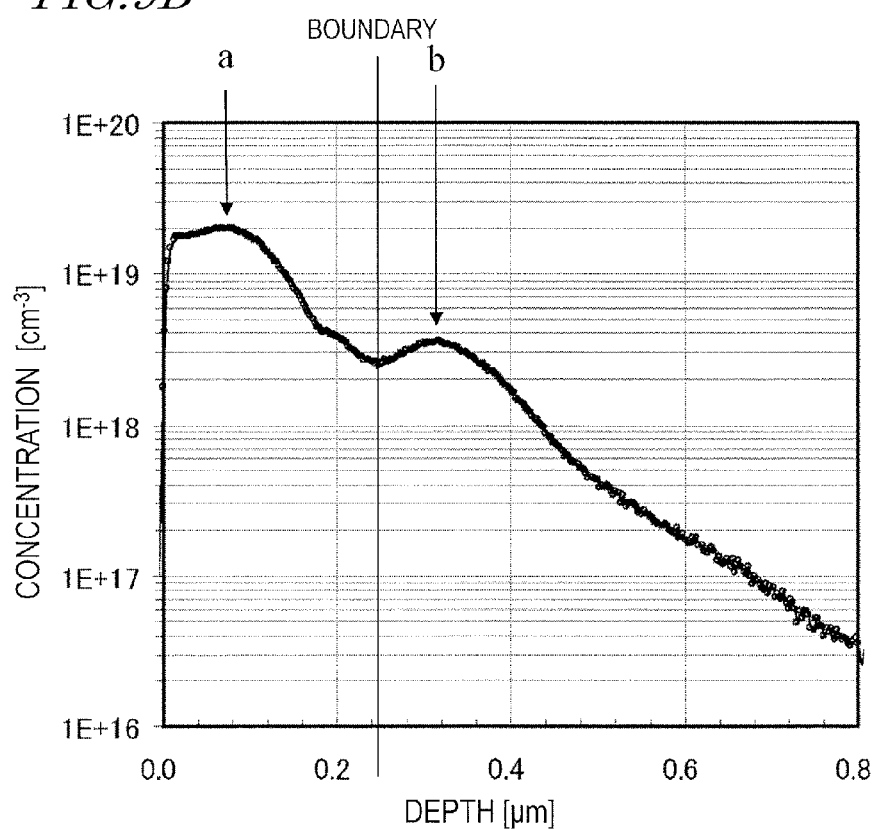
[FIG. 9B] Shows a dopant concentration profile that determines the boundary between the heavily doped and lightly doped ring regions of each ring region in the semiconductor device of the second embodiment.

The boundary between the heavily doped and lightly doped ring regions 30H and 30L and their dopant concentrations may be determined in the following manner. FIG. 9B shows the dopant concentration profile of the ring regions 30' as plotted in the depth direction with respect to the first principal surface 20f. As shown in FIG. 9B, there is a level with the lowest dopant concentration between the peak (a) at which the dopant concentration becomes maximum in the vicinity of the first principal surface 20f and another peak (b) of the dopant concentration which is located deeper than the peak (a). Such a level is defined herein to be the boundary between the heavily doped and lightly doped ring regions 30H and 30L. Also, if there are multiple peaks (b) of dopant concentration at such deep levels, two adjacent peaks with the largest dopant concentration peak value ratio are found from those peaks and the peak of the dopant concentration of the deeper one of the two is defined herein to be the peak (b) of dopant concentration.

In that case, the dopant concentration of the heavily doped ring region 30H is defined to be that of the region with the maximum value (a) and the average concentration of regions, of which the concentrations are at least a half as high as the maximum value. In the same way, the dopant concentration of the lightly doped ring region 30L is defined to be that of the region with the peak value (b) and the average concentration of regions, of which the concentrations are at least a half as high as the peak value.

When measured perpendicularly to the first principal surface 20f of the silicon carbide layer 20, the thickness t30H of the heavily doped ring region 30H is at least 15 nm, and the thickness t30L of the lightly doped ring region 30L is at least 100 nm. Thus, the overall thickness of the ring regions 30' is 115 nm or more.

In this semiconductor device 102, there are the heavily doped ring regions 30H and the lightly doped ring regions 30L in the terminal region Rt. Thus, by taking advantage of the difference in dopant concentration between the heavily doped and lightly doped ring regions 30H and 30L, the electric field applied to the ring regions 30' can be dispersed among the lightly doped ring regions 30L which are located under the heavily doped ring regions 30H. In addition, thanks to the electric field dispersion effect by the entire lower parts of the ring regions 30', the overconcentration of the electric field around the corners of the ring regions 30' can be reduced, too. Consequently, compared to an embodiment in which single-layer ring regions are provided, the decrease in breakdown voltage can be further limited.

Except for how to make the ring regions 30', this semiconductor device 102 can also be fabricated in the same procedure as the semiconductor device 101 of the first embodiment. Specifically, as shown in FIG. 5(c), Al or B ions are implanted through a mask (not shown) into the silicon carbide layer 20 so as to have the dopant concentration profile shown in FIG. 9B. In this manner, ring regions 30' including the heavily doped ring regions 30H and the lightly doped ring regions 30L and a p-well region (not shown) are formed. That is to say, just by positioning the mask with respect to the substrate 10 only once using the same mask, the heavily doped and lightly doped ring regions 30H and 30L can be formed. The rest of the manufacturing process may be performed as in the manufacturing process of the semiconductor device 101 of the first embodiment. According to such a method, the heavily doped and lightly doped ring regions 30H and 30L can be formed at the same time by performing a single manufacturing process step and the manufacturing process can be simplified. Also, when viewed perpendicularly to the first principal surface 20f, the heavily and lightly doped ring regions 30H and 30L can be formed at the same position within the terminal region Rt of the silicon carbide layer 20.

In the semiconductor device 102 of this embodiment, an $n^-$ layer (that is a third dopant layer) may also be further provided between the $n^+$ layer 21 and the $n^-$ layer 22 as in the first embodiment described above to limit a decrease in breakdown voltage. In the semiconductor device 102' shown in FIG. 10, the silicon carbide layer 20 further includes an $n^{--}$ layer 23 (that is a third dopant layer) between the $n^+$ layer 21 and the $n^-$ layer 22 as in the first embodiment described above.

Figure 10:
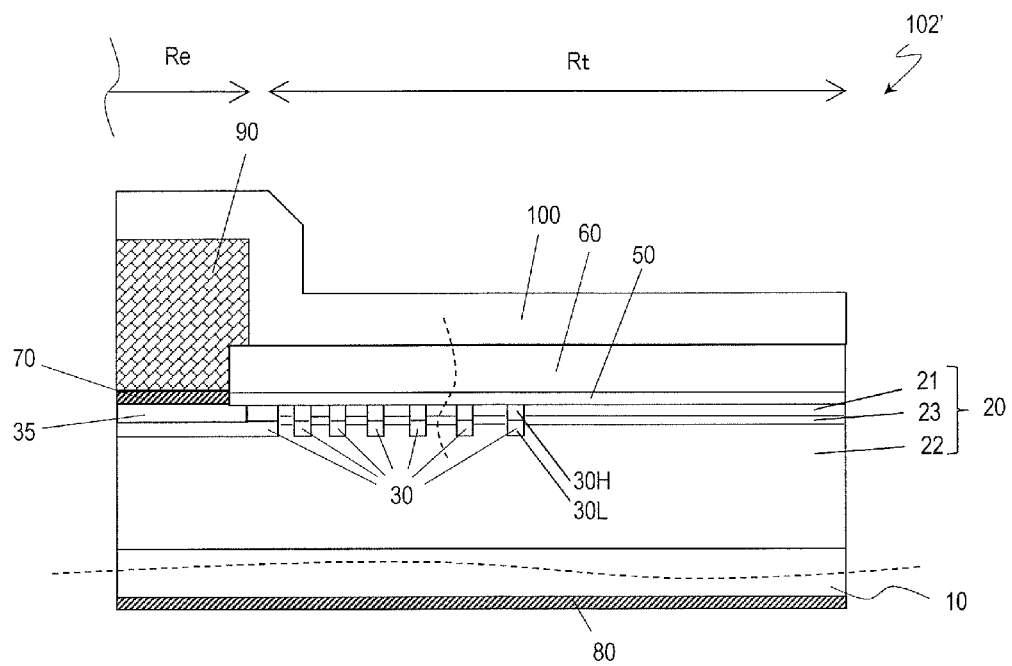
[FIG. 10] A cross-sectional view schematically illustrating a semiconductor device as a modified example of the second embodiment.

As shown in FIG. 10, the boundary between the heavily doped and lightly doped ring regions 30H and 30L is located in the $n^-$ layer 23 (that is the third dopant layer), which contacts with both of the heavily doped and lightly doped ring regions 30H and 30L.

The dopant concentration of the $n^-$ layer 23 is lower than that of the $n^-$ layer 21 and may be $5 \times 10^{15}$ cm$^{-3}$ or less. The $n^-$ layer 23 suitably contacts with the lower end of the $n^+$ layer 21 and the upper surface of the $n^-$ layer 23 is suitably located over the lower surface of the heavily doped ring regions 30H. As a result, an increase in the ON-state resistance of the element can be checked.

As can be seen, by providing the $n^-$ layer 23, the depletion layer to be formed in the silicon carbide layer 20 can be expanded and the breakdown voltage can be increased to and beyond the level of a structure with no $n^+$ layers 21.

Although first and second embodiments have been described as exemplary embodiments of the present invention, these embodiments are just an example of the present invention and readily modifiable in various manners. For example, even though the conductivity type of the substrate 10 is $n^+$-type, the conductivity type of the substrate 10 should be $p^+$-type if IGBTs need to be formed in the element region.

Industrial Applicability

According to a semiconductor device and method for fabricating the device as disclosed in the present application, high-breakdown-voltage SiC semiconductor devices can be provided with good stability by minimizing the dispersion in the breakdown voltage of the terminal structure. Consequently, the semiconductor device and method for fabricating the device as disclosed in the present application are applicable to various kinds of SiC semiconductor devices and can be used particularly effectively in an SiC semiconductor device to function as a power element.

Reference Signs List 10 substrate
20 silicon carbide layer
21 $n^+$ layer
22 $n^-$ layer
23 $n^-$layer
30, 30' ring region
30H heavily doped ring region
30L lightly doped ring region
31, 31' terminal structure
33 surface portion
35 p-type contact layer
50 thermal oxide film
60 interlevel dielectric film
70 p-side contact electrode
80 back surface electrode
90 line
100 passivation film

The invention claimed is:

1. A semiconductor device comprising a silicon carbide layer of a first conductivity type, the silicon carbide layer having a first principal surface and a second principal surface and including an element region and a terminal region which surrounds the element region on the first principal surface,
wherein the silicon carbide layer includes: a first dopant layer of the first conductivity type which contacts with the first principal surface; a second dopant layer of the first conductivity type which is located closer to the second principal surface than the first dopant layer is; and a third dopant layer of the first conductivity type which is located between the first and second dopant layers and has a lower dopant concentration than the second dopant layer and,
the terminal region has, in its surface portion with a predetermined depth as measured from the first principal surface, a terminal structure which includes a portion of the first dopant layer, a portion of the second dopant layer, and a ring region of a second conductivity type that runs through the first and third dopant layers to reach the second dopant layer,
the dopant concentration of the first dopant layer is twice to five times as high as the dopant concentration of the second dopant layer, when viewed along a normal to the first principal surface, the first dopant layer is arranged to contact with the ring region both inside and outside of the region.

2. The semiconductor device of claim 1, wherein the ring region includes a heavily doped ring region which contacts with the first principal surface of the silicon carbide layer and a lightly doped ring region which contacts with the bottom of the ring region,
the heavily doped ring region is thicker than the first dopant layer, and
the second conductivity type dopant concentration of the heavily doped ring region is twice or more as high as the second conductivity type dopant concentration of the lightly doped ring region.

3. The semiconductor device of claim 1, wherein the ring region includes a heavily doped ring region which contacts with the first principal surface of the silicon carbide layer and a lightly doped ring region which contacts with the bottom of the ring region,
the heavily doped ring region is thicker than the first dopant layer,
the third dopant layer contacts with the heavily doped ring region and the lightly doped ring region, and
the second conductivity type dopant concentration of the heavily doped ring region is twice or more as high as the second conductivity type dopant concentration of the lightly doped ring region.

4. The semiconductor device of claim 1, wherein the terminal structure is a field limited ring structure.

5. The semiconductor device of claim 1, wherein the terminal structure is a junction termination extension structure.

6. The semiconductor device of claim 1, further comprising a metal-insulator-semiconductor field effect transistor, at least a part of which is provided in the element region of the silicon carbide layer.

7. The semiconductor device of claim 1, further comprising an insulated gate bipolar transistor, at least a part of which is provided in the element region of the silicon carbide layer.

8. The semiconductor device of claim 1, further comprising a PN junction diode, at least a part of which is provided in the element region of the silicon carbide layer.

9. The semiconductor device of claim 1, further comprising a Schottky barrier diode, at least a part of which is provided in the element region of the silicon carbide layer.

10. The semiconductor device of claim 1, further comprising a junction field effect transistor, at least a part of which is provided in the element region of the silicon carbide layer.

11. A method for fabricating a semiconductor device with a silicon carbide layer of a first conductivity type which has a first principal surface and a second principal surface and which includes an element region and a terminal region that surrounds the element region on the first principal surface, the method comprising the steps of:
(a) forming a silicon carbide layer which includes a first dopant layer of the first conductivity type that contacts with the first principal surface, a second dopant layer of the first conductivity type that is located closer to the second principal surface than the first dopant layer is, and a third dopant layer of the first conductivity type which is located between the first and second dopant layers and has a lower dopant concentration than the second dopant layer;
(b) forming, in the silicon carbide layer, a terminal structure which includes a ring region of a second conductivity type that runs through the first dopant layer to reach the second dopant layer; and
(c) forming an insulating layer on the first principal surface of the silicon carbide layer,
wherein the dopant concentration of the first dopant layer is twice to five times as high as the dopant concentration of the second dopant layer, and
when viewed along a normal to the first principal surface, the first dopant layer is arranged to contact with the ring region both inside and outside of the region.

12. The method of claim 11, wherein the step (b) includes forming, using the same mask, a heavily doped ring region which contacts with the first principal surface of the silicon carbide layer and a lightly doped ring region which contacts with the second dopant layer at the bottom of the ring region.

* * * * *